United States Patent [19]

Matsui

[11] Patent Number: 5,357,479
[45] Date of Patent: Oct. 18, 1994

[54] STATIC RANDOM ACCESS MEMORY CAPABLE OF PREVENTING ERRONEOUS WRITING

[75] Inventor: Masataka Matsui, Tokyo, Japan

[73] Assignee: Kabushiki Kaisha Toshiba, Kawasaki, Japan

[21] Appl. No.: 693,608

[22] Filed: Apr. 30, 1991

[30] Foreign Application Priority Data

May 1, 1990 [JP] Japan .................... 2-115481

[51] Int. Cl.⁵ .......................... G11C 7/00; G11C 8/00
[52] U.S. Cl. .......................... 365/230.06; 365/194
[58] Field of Search ............... 365/194, 230.06, 233.5

[56] References Cited

U.S. PATENT DOCUMENTS

| | | | |
|---|---|---|---|
| 4,689,771 | 8/1987 | Wang et al. | 365/233.5 |
| 4,768,168 | 8/1988 | Watanabe | 365/230.06 X |
| 4,803,665 | 2/1989 | Kasa | 365/194 X |
| 4,849,937 | 7/1989 | Yoshimoto | 365/194 X |
| 4,931,998 | 6/1990 | Ootani et al. | 365/230.06 X |
| 4,985,865 | 1/1991 | Houston | 365/94 |
| 5,062,082 | 10/1991 | Choi | 365/194 X |
| 5,091,889 | 2/1992 | Hamano et al. | 365/233.5 |

FOREIGN PATENT DOCUMENTS

| | | | |
|---|---|---|---|
| 60690 | 1/1985 | Japan | 365/233.5 |
| 182595 | 9/1985 | Japan | 365/194 |

Primary Examiner—Benny Lee
Attorney, Agent, or Firm—Finnegan, Henderson, Farabow, Garrett & Dunner

[57] ABSTRACT

Memory cell arranged in a matrix configuration are selected by a particular word line to supply the stored data to particular bit lines. The row address decoder selects a particular word line based on the address signal, while the column address decoder selects particular bit lines based on the address signal. Each of the row address decoder and column address decoder contains a first decoder for decoding the address signal, a delay circuit for delaying the output from the first decoder when data is written into the memory cell, and a second decoder for receiving the output signals from the first decoder and delay circuit and based on these signals, selecting either a particular word line or particular bit lines.

13 Claims, 5 Drawing Sheets

STATIC RANDOM ACCESS MEMORY CAPABLE OF PREVENTING ERRONEOUS WRITING

Background of the Invention

1. Field of the Invention

This invention relates to a static semiconductor memory, and more particularly to a synchronous MOS (insulated-gate) static random access memory (hereinafter referred to as an SRAM).

2. Description of the Related Art

Figure 5:
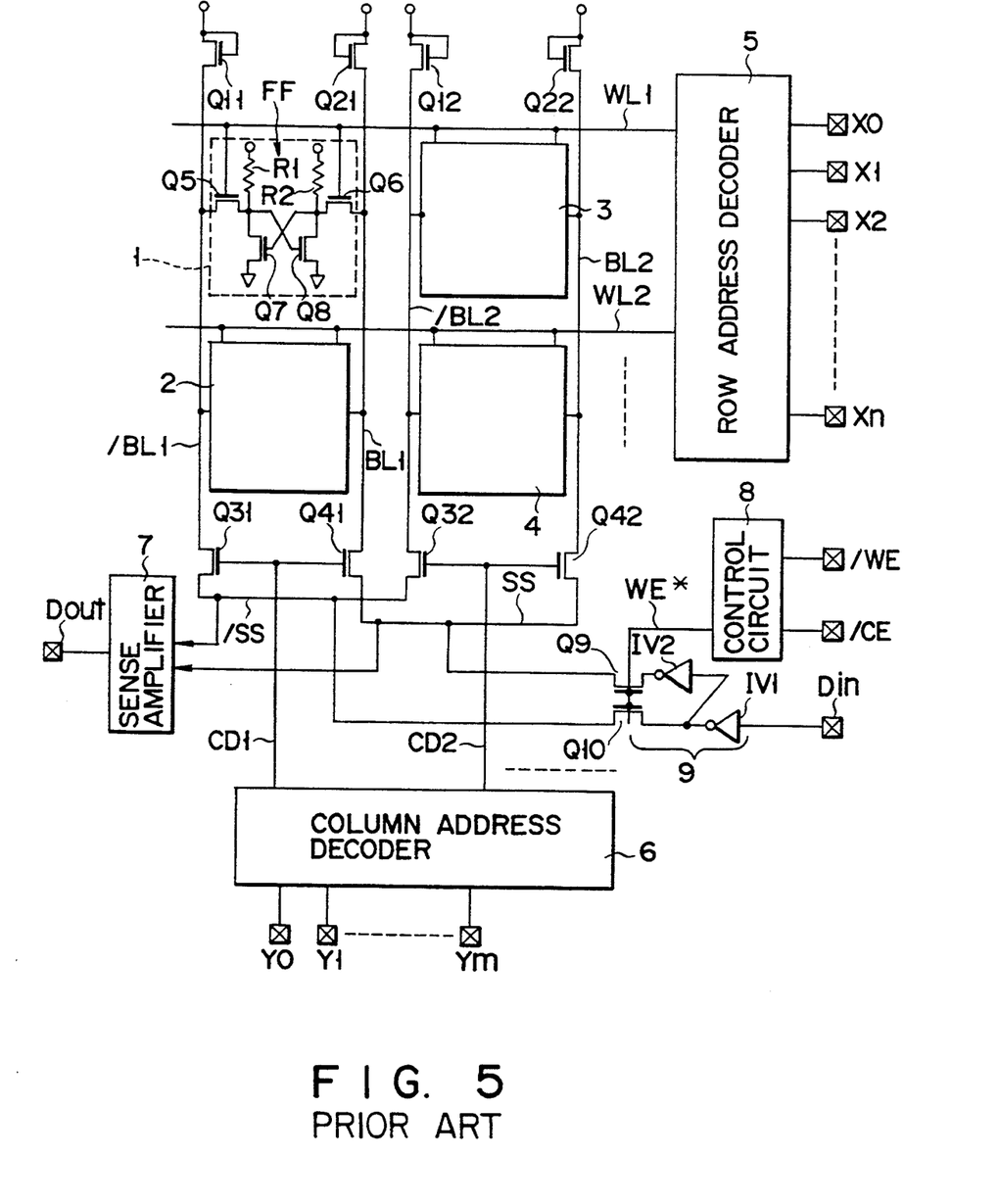
FIG. 5 is a schematic diagram for a conventional SRAM.

FIG. 5 is a circuit diagram of a conventional SRAM. In order to simplify drawings and clarify explanations, only two rows by two columns of static memory cells arranged in n rows by m columns are shown. Reference characters BL1 and /BL1 (the symbol"/" before the reference character indicates an inverting signal, hereinafter), and BL2 and /BL2 are pairs of complementary bit lines, while WL1 and WL2 are word lines. Bit lines BL1 and /BL1 each have one end connected to a power supply (not shown) via diode-connection transistors Q11 and Q21, respectively, whereas bit lines BL2 and /BL2 each have one end connected to a power supply (not shown) via diode-connection transistors Q12 and Q22, respectively.

Static memory cell (hereinafter, referred to as memory cell) 1 is connected to bit lines BL1 and /BL1 and word line WL1; memory cell 2 to bit lines BL1 and /BL1 and word line WL2; memory cell 3 to bit lines BL2 and /BL2 and word line WL1; and memory cell 4 to bit lines BL2 and /BL2 and word line WL2.

The memory cells 1 through 4 all have the same construction: each memory cell essentially consists of access transistors Q5 and Q6 and a flip-flop circuit FF composed of driver transistors Q7 and Q8 and resistors R1 and R2. The gate of each of the access transistors Q5 and Q6 is connected to the corresponding word line, while one end of its current path is connected to the flip-flop FF and the other end is connected to the corresponding bit line. These access transistors Q5 and Q6 allow the read data to be transferred from the flip-flop circuit FF to the bit lines or vice versa.

The word lines WL1 and WL2 are connected to a row address decoder 5, which selects one of word lines WL1 and WL2 according to address signals X1, X2, . . . , Xn.

A column address decoder 6 selects one of column lines CD1 and CD2 according to address signals Y0, Y1, Ym. The column line CD1 is connected to the gates of transistors Q31 and Q41. The transistors Q31 and Q41 each have one end of their current paths connected to the other ends of the bit lines /BL1 and BL1, respectively. The column line CD2 is connected to the gates of transistors Q32 and Q42. The transistors Q32 and Q42 each have one end of their current paths connected to the other ends of the bit lines /BL2 and BL2, respectively. The other ends of the current paths of transistors Q41 and Q42 are connected to each other via a common bit line SS connected to a sense amplifier 7, whereas the other ends of the current paths of transistors Q31 and Q32 are connected to each other via a common bit line /SS connected to the sense amplifier 7. The sense amplifier 7 produces an output signal $D_{out}$.

A control circuit 8 receives the write signal /WE and the chip enable signal /CE and based on these two signals, generates a write select signal WE*. An input signal $D_{in}$ is supplied to one end of the current path of each of transistors Q9 and Q10 via a buffer circuit 9 made up of inverter circuits IV1 and IV2. The write select signal WE* is supplied to the gates of transistors Q9 and Q10. The other end of the current path of transistor Q9 is connected to the common bit line SS, while the other end of the current path of transistor Q10 is connected to the common bit line /SS.

Figure 6:
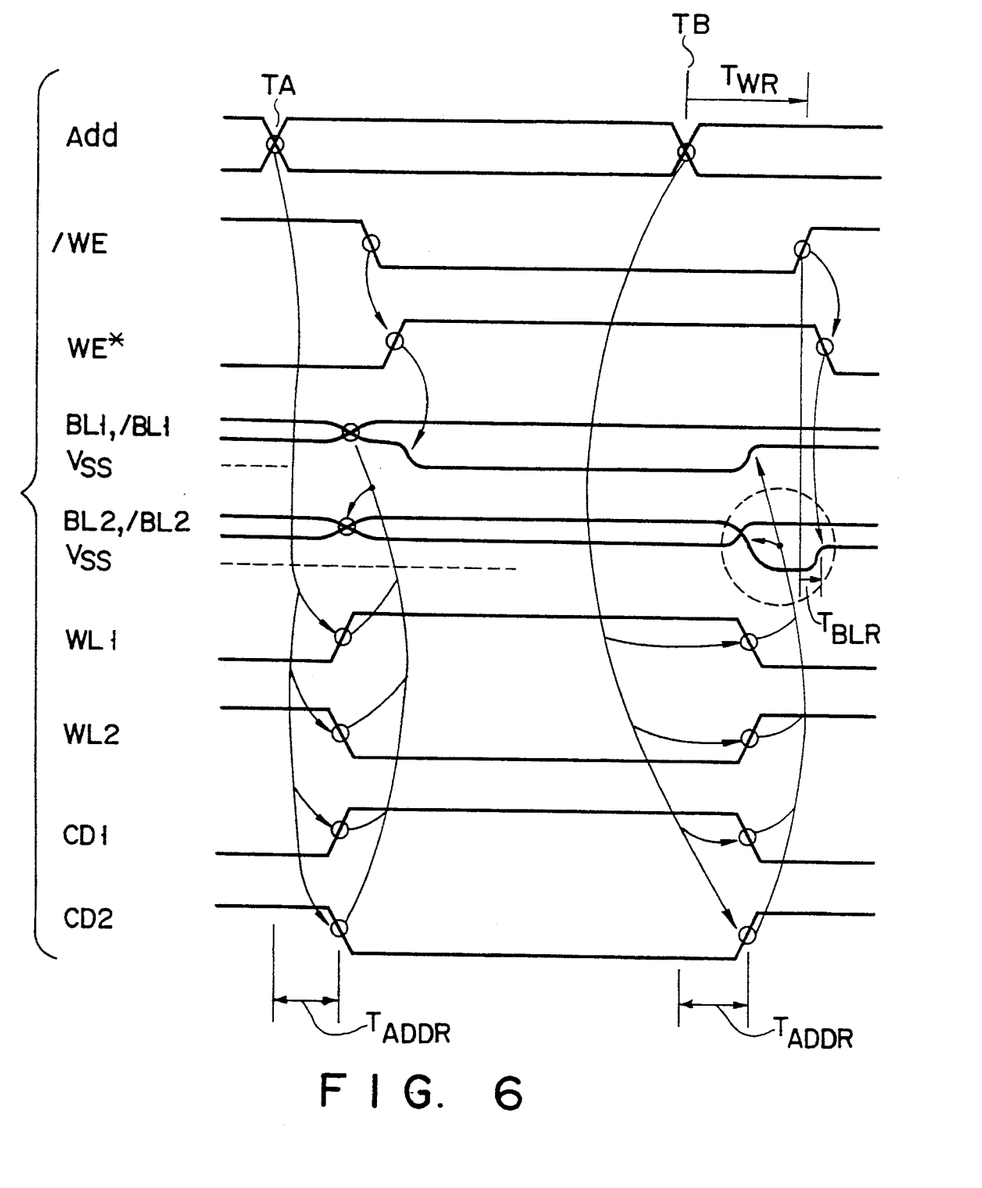
FIG. 6 is a timing chart for illustrating the operation of the SRAM in FIG. 5.

FIG. 6 show signals on various signal line show in FIG. 5, including /WE. WE*, BL1, /BL1, BL2, /BL2, WL1, WL2, CD1, and CD2. FIG. 6 also shows a supply voltage V.

Referring to FIG. 6, the read operation of an SRAM constructed as mentioned above will now be explained.

When the read address signal $A_{dd}$ changes at the time indicated by TA, the row address decoder 5 and column address decoder 6 will operate to select a particular memory cell corresponding to the address signal. For instance, when the word line WL1 and column line CD1 both connected to the memory cell 1 are selected, then the access transistors Q5 and Q6 in the memory cell 1 will turn on, causing the complementary data stored in the flip-flop circuit FF constituting the memory cell 1 to appear as small amplitude signals on the bit lines BL1 and /BL1. These small amplitude signals are supplied to the sense amplifier 7 via the on-state transistors Q31 and Q41 and the common bit lines SS and /SS. The sense amplifier 7 amplifies the input signals to a specified amplitude to produce the output signal $D_{out}$. The electric potential of the bit lines BL1 and /BL1 is restricted to a small magnitude by the pull-up transistors Q11 and Q21 during read operation.

On the other hand, the writing of data into the memory cell 1 begins by setting the write signal /WE to the low level 0. Based on the write signal /WE, the control circuit 8 produces the write select signal WE*, which causes the transistors Q9 and Q10 to be in the on state. Using the input signal $D_{in}$, the buffer circuit 9 generates a pair of complementary input signals, which is in turn supplied to the common bit lines SS and /SS via transistors Q9 and Q10. With the input signal $D_{in}$ in the low level 0, the bit line BL1 is set to 0 V, whereas with the input signal D in in the high level 1, the bit line /BL1 is set to 0 V. Depending on the voltages of these bit lines, data is written into memory cell 1.

The write operation ends by setting the write signal /WE to the high level 1. That is, according to the write signal /WE, the transistors Q9 and Q10 are placed in the off state, causing the buffer circuit 9 to be disconnected from the common bit lines SS and /SS, resulting in the levels of the bit lines and the common bit lines being are set to the same amplitudes as those during read operation, returning to the read state.

There is a time margin between the time at which a write operation finishes and the time at which the next read operation starts, which is known as the write recovery time $T_{WR}$, illustrated in FIG. 6. In general, it is desirable that after write operation is complete, next data should be able to be read even if the address signal is changed at the same time the write signal /WE is set to the high level. That is, the write recovery time $T_{WR}$ should be 0.

To guarantee the specification of the write recovery time $T_{WR}=0$, it is necessary for the memory cell to operate properly even under the conditions of $T_{WR}<0$. However, when $T_{WR}<0$ or when the address signal is changed before the write signal /WE returns to the high level, data can be written erroneously into the memory cell corresponding the next address. This mechanism will now be described, referring to FIG. 6.

Here, it is assumed that with $T_{WR}<0$, the current write address is cell 1 and the next write address is cell 4. When the address signal $A_{dd}$ changes at the time indicated by TB, the row address decoder 5 operates to select the word line WL2 in place of WL1, while the column address decoder 6 operates to select column line CD2 instead of CD1. As a result, cell 4 is selected. At this time, the write signal /WE returns to the high level, causing the write select signal WE* to be in the low level, thereby turning transistors Q9 and Q10 off. If the returning of the bit lines to the write state is later than the selection of cell 4 based on the change of the contents of the address decoder, either bit line BL2 or /BL2 of cell 4 is pulled down to nearly 0 v. At this moment, if the data stored in cell 4 is a logic 1, a logic 0 will be written into cell 4 to destroy its contents. Therefore, to read the data from the next address properly, the write recovery time $T_{WR}$ must meet the conditions that the period of time between the time at which the address starts changing and the time at which the word and column lines are selected, or the address decode time $T_{ADDR}$, is longer than the period of time $T_{BLR}$ between the time at which the write signal /WE goes high and the time at which the bit lines return to the read level. This gives the following relation as:

$$T_{WR} \geq T_{BLR} - T_{ADDR}$$

In high-speed SRAMs, the shorter the address decode time $T_{ADDR}$, the faster the access time. Thus, the address decoder is designed so as to minimize $T_{ADDR}$. In recent devices, address decoders use the same construction for read and write operations to shorten the address decode time to the order of several nanoseconds. Moreover, as MOS transistors have been made much smaller, their operation speed tends to be much faster. Therefore, it is difficult to reduce the effective value of the write recovery time $T_{WR}$ to zero.

To avoid this difficulty, a method has been proposed which prevents the write operation for a fixed period of time using an address transition detecting circuit when the address changes in the course of writing. This method, however, is applicable only to externally-asynchronous and internally-synchronous SRAMs, which synchronize the internal circuitry with the address signal, using an address transition detecting circuit, but appear as a synchronous when viewed from the outside. Thus, this technique cannot be applied to completely a synchronous SRAMs such as BiCMOS-based SRAMs.

SUMMARY OF THE INVENTION

The object of the present invention is to provide a static random access memory capable of not only preventing erroneous writing but also speeding up operation after the return of write signal to the high level.

The foregoing object is accomplished by a static memory comprising: a memory cell array whose memory cells are arranged in matrix form, each memory cell being selected by a particular word line to supply the stored data to particular bit lines; and an address decoder for outputting a selecting signal for selecting a particular word line and bit lines on the basis of an address signal at the time of writing and reading, which contains a delay circuit for delaying the selecting signal at the time of writing data into the memory cell.

With this invention, making the address decode time in the write operation later than that in the read operation delays the selection of a memory cell corresponding to the next address, thereby preventing erroneous writing into the next memory cell.

Moreover, allowing an operating margin for the write recovery time $T_{WR} \leq 0$ warrants the specification of $T_{WR}=0$.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be explained, referring to the accompanying drawings.

Figure 1:
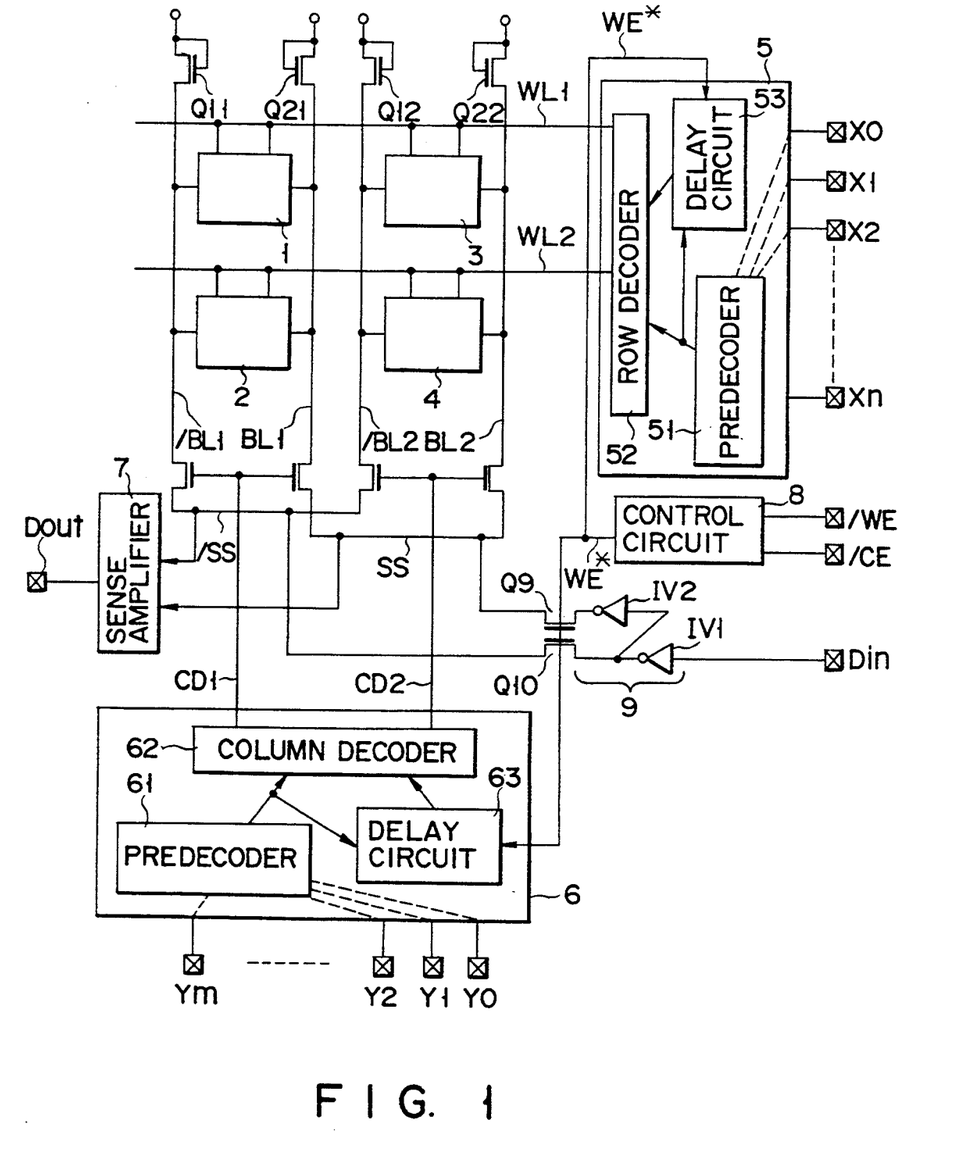
FIG. 1 is a schematic diagram for an embodiment of the present invention.

FIG. 1 shows a static memory according to an embodiment of the present invention. Like parts are indicated by like reference characters in FIG. 1 and FIG. 5 and explanation will be focused on the differences between them.

In this invention, the row address decoder 5 and column address decoder 6 are different in construction from those in FIG. 5. That is, in the row address decoder 5, address signals X0, X1, X2, ..., Xn are supplied to a predecoder 51, which supplies the output signal to a row decoder 52 in two different routes: one in which the signal is directly supplied to the decoder 52, and the other in which the signal is supplied indirectly to the decoder 52 via a delay circuit 53. The row decoder 52 selects one of word lines WL1 and WL2 according to the signal it receives.

In the column address decoder 6, address signals Y0, Y1, Y2, ..., Ym are supplied to a predecoder 61, which supplies the output signal to a column decoder 62 in two different routes: one in which the signal is directly supplied to the decoder 62, and the other in which the signal is supplied indirectly to the decoder 62 via a delay circuit 63. The column decoder 62 selects one of column lines CD1 and CD2 according to the signal it receives. The delay circuits 53 and 63 are each controlled so as to delay or not to delay the output signals from the predecoders 51 and 61, on the basis of the write select signal WE* from the control circuit 8.

While in this embodiment, the delay circuits 53 and 63 are connected between the predecoder 51 and row decoder 52 and between the predecoder 61 and column decoder 62, respectively, their connecting position is not restricted to these places.

In the above arrangement, to read data, according to address signals X0, X1, X2, ..., Xn, and Y0, Y1, Y2, .

..., Yn, the word and bit lines are selected by the row address decoder 5 and column address decoder 6 and the data stored in the corresponding memory cell is transferred to the common bit lines SS and /SS. The transferred data is output via the sense amplifier 7.

In write operation, setting the write signal /WE to the low level causes the write select signal WE* to be output, putting the transistors Q9 and Q10 in the on state. The input signal $D_{in}$ has its waveform shaped at the buffer circuit 9, which includes inverters IV1 and IV2 and is then transferred to the common bit lines SS and /SS via the on-state transistors Q9 and Q10. The data transferred to the bit lines SS and /SS is supplied to the bit lines selected by the column address decoder 6. The data supplied to the bit lines is written into the memory cell corresponding to the word line selected by the row address decoder 5.

As described above, data read and write operations themselves are generally the same as the prior art. When viewed in more detail, the row address decoder 5 and column address decoder 6 operate differently from the prior art in terms of data read and write operations. Specifically, when the control circuit 8 supplies the write select signal WE* in write operation, the delay circuits 53 and 63 delay the memory cell-selecting signals from the predecoders 51 and 61 for a specified period of time, and supply the resulting signals to the row decoder 52 and column decoder 62, respectively.

In data read operation, the signals from the predecoders 51 and 61 are directly supplied to the row decoder 52 and column decoder 62 respectively, not by way of the delay circuits 53 and 63. As a result, the delay circuits 53 and 63 make the address select time for write operation later than that for read operation at the row address decoder 51 and column address decoder 61, respectively.

Figure 2:
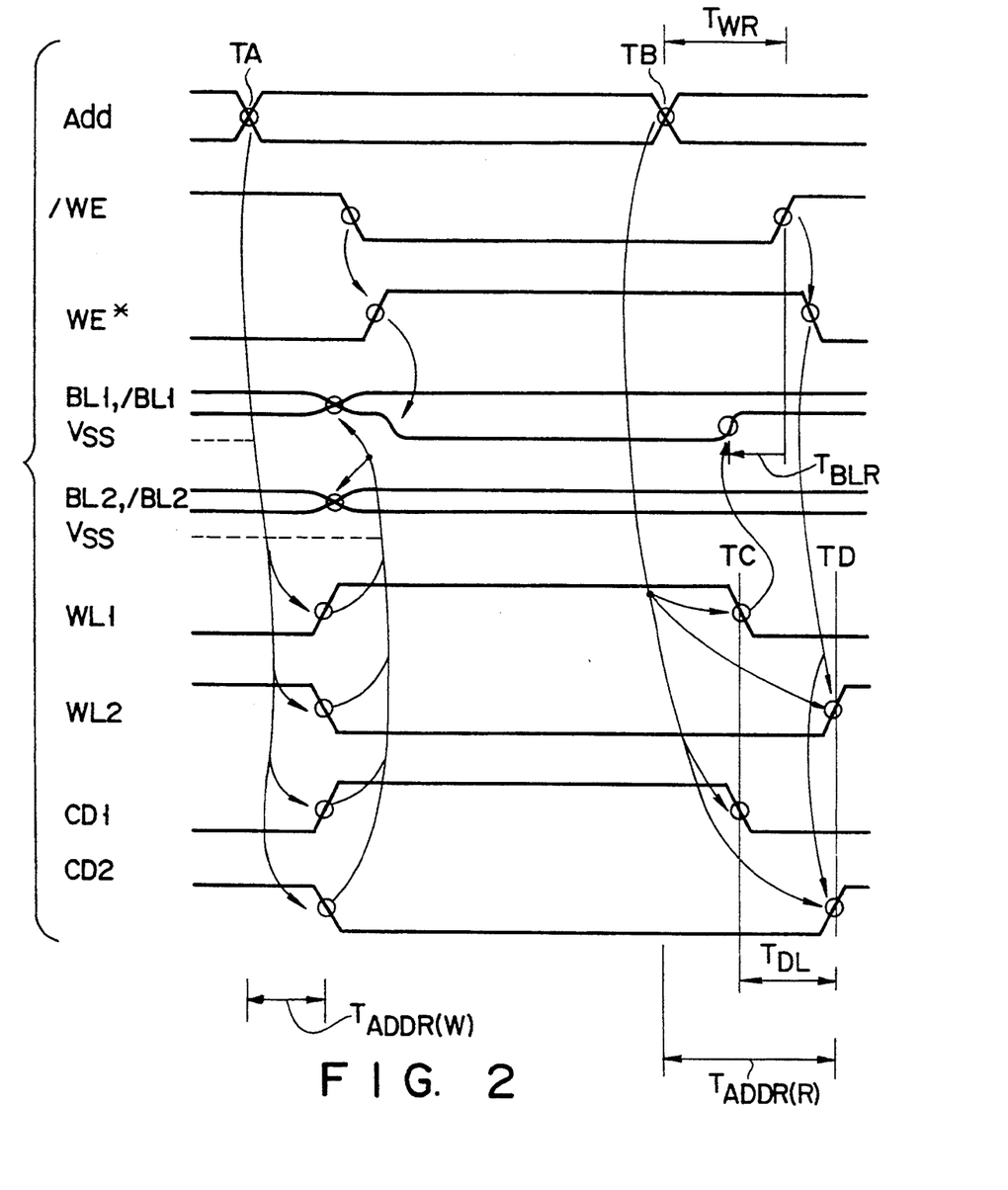
FIG. 2 is a timing chart used to describe the operation of the embodiment of FIG. 1.

FIG. 2 shows signals on various signal line shown in FIG. 1, including /WE, WE*, BL1, /BL1, BL2, WL1, WL2, CD1, and CD2. FIG. 2 also shows a supply voltage $V_{ss}$.

Referring to FIG. 2, the above operation will be described in more detail.

The operation at the beginning of writing is the same as with FIG. 6 and hence the operation at the end of writing or at the time of write recovery will now be explained. As with FIG. 6, the write recovery time is $T_{WR} < 0$, and the address signal $A_{dd}$ changes at times TA and TB.

For instance, in the course of writing data into memory cell 1, when the address signal $A_{dd}$ changes at TB in FIG. 2, the row address decoder 5 and column address decoder 6 operate to select a particular memory cell (e.g., memory cell 4) corresponding to the next address in place of memory cell 1 being written into. In the row address decoder 5 and column address decoder 6, unselective signals, which select no memory cells, function at the same speed as during reading, causing the word line WL1 and column line CD1 to be unselected or in the low level state (indicated by TC in FIG. 2). On the other hand, the select signals, which select a particular memory cell, go by way of the delay circuits 53 and 63, respectively, with the result that their effect appears slower than in the read operation. Thus, the word line WL2 and column line CD2 corresponding to the next address will not be selected, which prevents erroneous data to be written into memory cell 4. In the meantime, when the write signal /WE returns to the high level, the select signals from the predecoders 51 and 61 are supplied directly to the row decoder 52 and column decoder 62 respectively, not by way of the delay circuits 53 and 63. Thus, as with normal reading, the word line WL2 and column line CD2 are selected at a high speed to read data (indicated by TD in FIG. 2). Consequently, the time required to read data after the write signal returns to the high level or the access time never get slower.

In an SRAM according to the preferred embodiments of the present invention, the address select time for writing, $T_{ADDR}(W)$, becomes longer than that for reading, $T_{ADDR}(R)$, by the delay time $T_{DL}$ at the delay circuits 53 and 63. Thus, the write recovery time $T_{WR}$ is expressed as:

$$T_{WR} \geq T_{BLR} - T_{ADDR(W)}$$
$$\geq T_{BLR} - T_{ADDR(R)} - T_{DL}$$

Therefore, it is possible to allow the write recovery time for a margin of the delay time $T_{DL}$ without adverse effects on the access time for reading.

In the above embodiment where the delay circuits 53 and 63 delay the select signals from the predecoders 51 and 61 for a specified period of time, the unselective signals may or may not go by way of the delay circuits 53 and 63.

Figure 3:
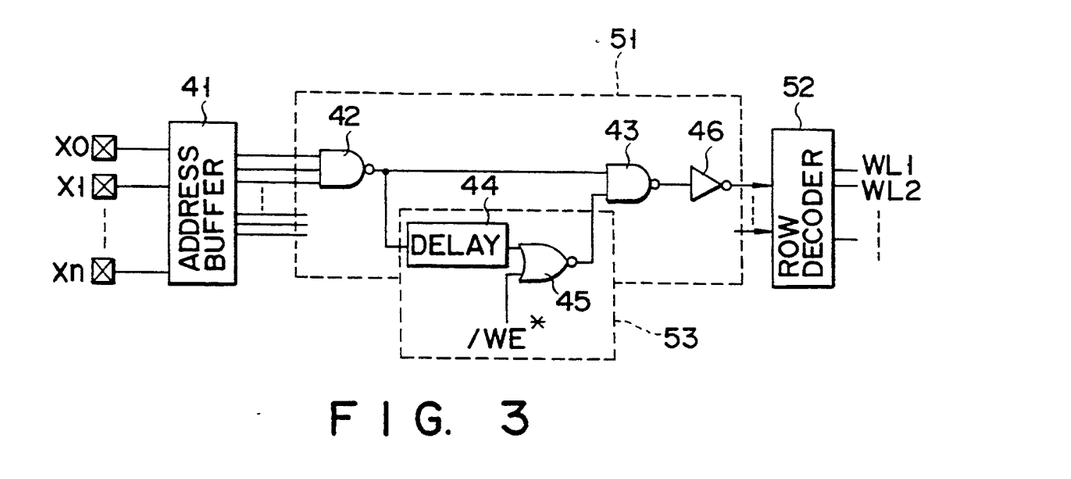
FIG. 3 is a circuit diagram for an embodiment of the row address decoder of FIG. 1.

FIG. 3 illustrates an embodiment of the row address decoder 5.

Address signals X0, X1, X2, ..., Xn are supplied to an address buffer 41, which stores address signals X1, X2, ..., Xn temporarily. The output of the buffer circuit 41 is connected to a plurality of NAND circuits 42 constituting the predecoder 51. One output of the NAND circuit 42 is connected to one input of a NAND circuit 43, while the other output is connected to one input of an OR circuit 45 via a delay element 44 constituting the delay circuit 53. The other input of the OR circuit 45 is supplied with the write select signal /WE* (the inverted signal of WE*). The output of the OR circuit 45 is connected to the other input of the NAND circuit 43. The output of the NAND circuit 43 is connected to the input of the row decoder 52 via an inverter circuit 46.

With such an arrangement, in data write operation, one output signal from the NAND circuit 42 is directly supplied to the NAND circuit 43, whereas the other output signal is supplied to the NAND circuit 43 via the delay element 44 and OR circuit 45, which delays the determination of output logic at the NAND circuit 43 for the delay time set at the delay element 44. Therefore, the memory cell select time is delayed accordingly.

In data read operation, the OR circuit 45 always supplies the high level signal according to the write select signal /WE. Therefore, the output logic at the NAND circuit 43 is determined as soon as the NAND circuit 42 outputs a signal. As a result, the memory cell select time is also fast.

Although the delay circuit 53 is installed in the predecoder 51, it is not restricted to this and may be added to the address buffer 41 or the row decoder 52.

Figure 4:
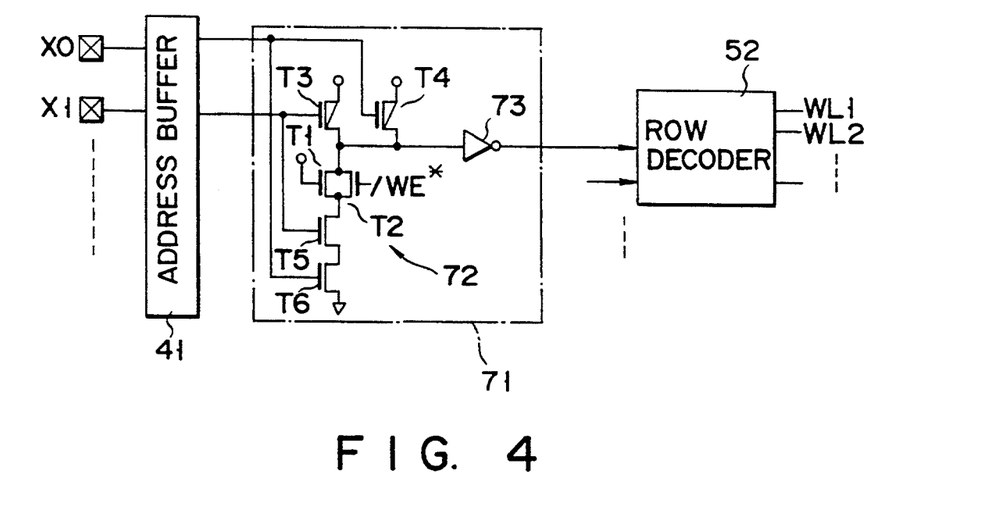
FIG. 4 is a circuit diagram for another embodiment of the row address decoder of FIG. 1.

FIG. 4 shows another embodiment of the row address decoder. Like parts are indicated by like reference characters in FIG. 4 and FIG. 3. The predecoder in this embodiment also includes a delay circuit.

Namely, the predecoder 71 is composed of a NAND circuit 72 and an inverter circuit 73. The NAND circuit 72, made up of transistors T3, T4, T5, and T6, also includes a transistor T1 constituting a delay element and a transistor T2 inserting the delay element of transistor T1 in the NAND circuit 72 or short-circuiting the element.

That is, the gates of transistors T3 and T4 are connected to the output of the address buffer 41. One end of the current path of each of transistors T3 and T4 is connected to a first power supply (not shown), while the other end of the current path is connected to the input of an inverter 73 as well as to one end of the current path of the transistor T5 via transistors T1 and T2 whose current paths are connected in parallel. The other end of current path of transistor T5 is connected to a second power supply (the ground) via the transistor T6. The gates of transistors T5 and T6 are connected to the gates of the transistors T3 and T4, respectively.

The transistor T1 is placed in the normally on state, while the transistor T2 is on-off controlled with the write select signal /WE*. Additionally, the transistor T1 is set to have a smaller current drive capacity than the transistor T2 to act as a delay element.

With the above arrangement, to write data, the transistor T2 is turned off with the write select signal /WE*, permitting current to flow through transistor T1. This delays the determination of the output logic at the NAND circuit compared with when the transistor T2 is on. Accordingly, the memory cell select time is also delayed.

The column address decoder 6 has the same construction as the row address decoder 5 in FIGS. 3 and 4.

This invention may be practiced or embodied in still other ways without departing from the spirit or essential character thereof.

What is claimed is:

1. A static memory comprising:
   means for receiving an address signal and a write signal;
   a plurality of word lines;
   a plurality of bit lines;
   a memory cell array including memory cells arranged in a matrix, each memory cell being coupled to one of the word lines and to one of the bit lines;
   a row address decoder, coupled to the receiving means and to the word lines, for selecting one of the word lines in response to a change in the address signal, by decoding the address signal, the row address decoder having a first response time between a change in the address signal and selecting one of the word lines when the write signal indicates a write operation, and a response time shorter than the first response time when the write signal indicates no write operation; and
   a column address decoder, coupled to the receiving means and to the bit lines, for selecting one of the bit lines in response to a change in the address signal, by decoding the address signal, the column address decoder having a second response time between a change in the address signal and selecting one of the bit lines when the write signal indicates a write operation, and a response time shorter than the second response time when the write signal indicates no write operation.

2. A static memory according to claim 1, wherein said row address decoder comprises:
   a first decoder for decoding said address signal and for generating a first signal;
   a delay circuit for delaying the first signal during writing and for generating a second signal; and
   a second decoder for receiving the first signal and the second signal and, based on these signals, selecting one of the word lines.

3. A static memory according to claim 1, wherein said row address decoder comprises:
   a first decoder for decoding said address signal and generating a first signal;
   a delay element for delaying the first signal and generating a second signal;
   a NOR circuit for receiving the second signal at one input and the write signal at another input and generating a third signal; and
   a second decoder for receiving the first signal and the third signal and, based on these signals, selecting one of the word lines.

4. A static memory according to claim 1, wherein said row address decoder comprises:
   a first decoder for generating an output signal, the first decoder including first and second transistors, each having a gate responsive to said address signal, and a current path, the current paths of the first and second transistors being coupled in parallel with each other;
   third and fourth transistors, each having a gate responsive to said address signal, and a current path, the current path of the third and fourth transistors being coupled in series with each other;
   fifth and sixth transistors, each having a current path, the current path of the fifth and sixth transistors being coupled in parallel with each other and between the current paths of said first and second transistors and the current path of said third transistor, the sixth transistor being on during writing, the sixth transistor having a first current driving capacity and the fifth transistor having a current driving capacity smaller than the first current driving capacity; and
   a second decoder, coupled to the current paths of the first and second transistors, for generating a signal to select one of said word lines in response to the output signal from the first decoder.

5. A static memory according to claim 1, wherein said column address decoder comprises:
   a first decoder for decoding said address signal and for generating a first signal;
   a delay circuit for delaying the first signal during writing and for generating a second signal; and
   a second decoder for receiving the first signal and the second signal and, based on these signals, selecting one of the bit lines.

6. A static memory according to claim 1, wherein said column address decoder comprises:
   a first decoder for decoding said address signal and generating a first signal;
   a delay element for delaying the first signal and generating a second signal;
   a NOR circuit for receiving the second signal at one input and the write signal at another input and generating a third signal; and
   a second decoder for receiving the first signal and the third signal and, based on these signals, selecting one of the bit lines.

7. A static memory according to claim 1, wherein said column address decoder comprises:
   a first decoder for generating an output signal, the first decoder including first and second transistors, each having a gate responsive to said address signal, and a current path, the current paths of the first and second transistors being coupled in parallel with each other;

third and fourth transistors, each having a gate responsive to said address signal, and a current path, the current path of the third and fourth transistors being coupled in series with each other;

fifth and sixth transistors, each having a current path, the current path of the fifth and sixth transistors being coupled in parallel with each other and between the current paths of said first and second transistors and the current path of said third transistor, the sixth transistor being on during writing, the sixth transistor having a first current driving capacity and the fifth transistor having a current driving capacity smaller than the first current driving capacity; and a second decoder, coupled to the current paths of the first and second transistors, for generating a signal to select one of said bit lines.

8. A static memory comprising:

means for receiving an address signal and a write signal;

a plurality of word lines;

a plurality of bit lines;

a memory cell array including memory cells arranged in a matrix, each memory cell being coupled to one of the word lines and to one of the bit lines;

a row address decoder, coupled to the receiving means and to the word lines, for selecting one of the word lines in response to a change in the address signal, by decoding the address signal, the row address decoder having a first response time between a change in the address signal and selecting one of the word lines when the write signal indicates a write operation, and a response time shorter than the first response time when the write signal indicates no write operation; and a column address decoder coupled to the receiving means and to the bit lines, for selecting one of the bit lines in response to a change in the address signal, by decoding the address signal.

9. A static memory according to claim 8, wherein the row address decoder comprises:

a first decoder for decoding the address signal and generating a first signal;

a delay element for delaying the first signal and generating a second signal;

a NOR circuit for receiving the second signal at one input and the write signal at another input and generating a third signal; and a second decoder for receiving the first signal and the third signal and, based on these signals, selecting one of the word lines.

10. A static memory according to claim 8, wherein the row address decoder comprises:

a first decoder for generating an output signal, the first decoder including first and second transistors, each having a gate responsive to the address signal, and a current path, the current paths of the first and second transistors being coupled in parallel with each other;

third and fourth transistors, each having a gate responsive to the address signal, and a current path, the current path of the third and fourth transistors being coupled in series with each other;

fifth and sixth transistors, each having a current path, the current path of the fifth and sixth transistors being coupled in parallel with each other and between the current paths of the first and second transistors and the current path of the third transistor, the sixth transistor being on during writing, the fifth transistor having a first current driving capacity and the sixth transistor having a current driving capacity higher than the first current driving capacity; and a second decoder, coupled to the current paths of the first and second transistors, for selecting one of the word lines.

11. A static memory according to claim 8, wherein the row address decoder comprises:

a first decoder for decoding said address signal and for generating a first signal;

a delay circuit for delaying the first signal during writing and for generating a second signal; and a second decoder for receiving the first signal and the second signal and based on these signals, selecting one of the word lines.

12. A static memory comprising:

means for receiving an address signal and a write signal;

a plurality of word lines;

a plurality of bit lines;

a memory cell array including memory cells arranged in a matrix, each memory cell being coupled to one of the word lines and to one of the bit lines;

a row address decoder, coupled to the receiving means and to the word lines, for generating a first selecting signal for selecting a word line, the row address decoder including a first decoder for decoding the address signal to generate a first decoded signal, a first delay circuit for selectively delaying the first decoded signal, depending upon whether the write signal indicates a write operation, to generate a second decoded signal, and a second decoder for decoding the first and second decoded signals to generate the first selecting signal; and a column address decoder, coupled to the receiving means and to the bit lines, for generating a second selecting signal for selecting a bit line, the column address decoder including a third decoder for decoding the address signal to generate a third decoded signal, a second delay circuit for selectively delaying the third decoded signal, depending upon whether the write signal indicates a write operation, to generate a fourth decoded signal, and a fourth decoder for decoding the third and fourth decoded signals to generate the second selecting signal.

13. A static memory comprising:

means for receiving an address signal and a write signal;

a plurality of word lines;

a plurality of bit lines;

a memory cell array including memory cells arranged in a matrix, each memory cell being coupled to one of the word lines and to one of the bit lines;

a row address decoder, coupled to the receiving means and to the word lines, for selecting one of the word lines on the basis of the address signal, the row address decoder including first and second transistors, each having a gate responsive to said address signal, and a current path, the current paths of the first and second transistors being coupled in parallel with each other;

third and fourth transistors, each having a gate responsive to said address signal, and a current path, the current path of the third and fourth transistors being coupled in series with each other;

fifth and sixth transistors, each having a current path, the current path of the fifth and sixth transistors being coupled in parallel with each other and between the current paths of said first and second transistors and the current path of said third transistor, the sixth transistor having a gate responsive to the write signal, the sixth transistor having a first current driving capacity and the fifth transistor having a current driving capacity smaller than the first current driving capacity; and a decoder, coupled to the current paths of the first and second transistors, for selecting a word line; and a column address decoder, coupled to the receiving means and to the bit lines, for selecting one of the bit lines in response to the address signal.

* * * * *

UNITED STATES PATENT AND TRADEMARK OFFICE
CERTIFICATE OF CORRECTION

PATENT NO. : 5,357,479
DATED : October 18, 1994
INVENTOR(S) : Masataka Matsui

It is certified that error appears in the above-indentified patent and that said Letters Patent is hereby corrected as shown below:

Abstract, Title page, line 2 change "cell" to --cells--.

Signed and Sealed this

Ninth Day of May, 1995

Attest:

BRUCE LEHMAN

*Attesting Officer*   *Commissioner of Patents and Trademarks*